(12) United States Patent
An

(10) Patent No.: US 12,048,328 B2
(45) Date of Patent: Jul. 30, 2024

(54) OPTICAL MODULE AND AEROSOL GENERATION DEVICE COMPRISING SAME

(71) Applicant: KT&G CORPORATION, Daejeon (KR)

(72) Inventor: Hwi Kyeong An, Seoul (KR)

(73) Assignee: KT&G CORPORATION, Daejeon (KR)

( * ) Notice: Subject to any disclaimer, the term of this patent is extended or adjusted under 35 U.S.C. 154(b) by 0 days.

(21) Appl. No.: 16/650,267

(22) PCT Filed: Oct. 26, 2018

(86) PCT No.: PCT/KR2018/012773
§ 371 (c)(1),
(2) Date: Mar. 24, 2020

(87) PCT Pub. No.: WO2019/088577
PCT Pub. Date: May 9, 2019

(65) Prior Publication Data
US 2020/0268055 A1    Aug. 27, 2020

(30) Foreign Application Priority Data

Oct. 30, 2017  (KR) .................. 10-2017-0142578
Jun. 18, 2018  (KR) .................. 10-2018-0069645

(51) Int. Cl.
*F21V 3/04* (2018.01)
*A24B 15/167* (2020.01)
(Continued)

(52) U.S. Cl.
CPC ............ *A24F 40/42* (2020.01); *A24B 15/167* (2016.11); *A24D 1/20* (2020.01); *A24D 3/17* (2020.01);
(Continued)

(58) Field of Classification Search
CPC ... A24F 40/60; F21V 3/00; F21V 5/00; F21V 5/04; G02B 19/0009; G02B 19/0061;
(Continued)

(56) References Cited

U.S. PATENT DOCUMENTS 2,623,313 A * 12/1952 Fuchs .................. G02B 6/0091
                                                    362/812
4,443,832 A *  4/1984 Kanamori ................ B60Q 1/26
                                                    428/31
(Continued)

FOREIGN PATENT DOCUMENTS

CA     2 778 903 A1    5/2011
CA     2 970 045 A1    6/2016
(Continued)

OTHER PUBLICATIONS

Communication dated Jul. 27, 2020 by the Russian Patent Office in application No. 2020110821.
(Continued)

*Primary Examiner* — Omar Rojas Cadima
(74) *Attorney, Agent, or Firm* — Sughrue Mion, PLLC

(57) ABSTRACT

An optical module includes a light-emitting portion for emitting light and a display including a first surface having a first transmission region through which at least a portion of the light emitted from the light-emitting portion is transmitted and a first blocking region which is surface-treated to block transmission of the light, and a second surface which the light transmitted through the first transmission region reaches to deliver an image to a user, wherein the first transmission region may include a path changing member for changing a propagation path of the transmitted light.

9 Claims, 8 Drawing Sheets

(51) Int. Cl.

| | | |
|---|---|---|
| *A24D 1/20* | (2020.01) | |
| *A24D 3/17* | (2020.01) | |
| *A24F 15/01* | (2020.01) | |
| *A24F 40/10* | (2020.01) | |
| *A24F 40/30* | (2020.01) | |
| *A24F 40/40* | (2020.01) | |
| *A24F 40/42* | (2020.01) | |
| *A24F 40/44* | (2020.01) | |
| *A24F 40/46* | (2020.01) | |
| *A24F 40/485* | (2020.01) | |
| *A24F 40/50* | (2020.01) | |
| *A24F 40/57* | (2020.01) | |
| *A24F 40/60* | (2020.01) | |
| *A24F 40/65* | (2020.01) | |
| *A24F 40/90* | (2020.01) | |
| *A24F 40/95* | (2020.01) | |
| *F21V 3/00* | (2015.01) | |
| *F21V 5/00* | (2018.01) | |
| *G02B 19/00* | (2006.01) | |
| *H05B 3/54* | (2006.01) | |
| *H05K 1/02* | (2006.01) | |
| *H05K 1/14* | (2006.01) | |
| *H05K 1/18* | (2006.01) | |
| *A24F 40/20* | (2020.01) | |
| *A24F 40/51* | (2020.01) | |
| *F21Y 115/10* | (2016.01) | |

(52) U.S. Cl.
CPC .............. *A24F 15/01* (2020.01); *A24F 40/10* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/20* (2020.01); *A24F 40/51* (2020.01); *F21Y 2115/10* (2016.08); *H05K 2201/012* (2013.01); *H05K 2201/0154* (2013.01); *H05K 2201/10219* (2013.01)

(58) Field of Classification Search
CPC ............ G02B 19/0014; G02B 19/0071; H01H 13/023; H01H 9/161; H01H 2219/066; H01H 2219/058; H01H 2009/183; H01H 23/025; B60Q 3/82; B60Q 3/14; F21W 2106/00; F21W 2111/00; G09F 13/08; G09F 13/20; G09F 13/04; G09F 13/06; F21Y 2115/10; H01L 33/58; A46B 15/0044
See application file for complete search history.

(56) References Cited

U.S. PATENT DOCUMENTS

| | | |
|---|---|---|
| 5,348,027 A | 9/1994 | Barnes et al. |
| 5,388,594 A | 2/1995 | Counts et al. |
| 5,408,574 A | 4/1995 | Deevi et al. |
| 5,505,214 A | 4/1996 | Collins et al. |
| 5,555,476 A | 9/1996 | Suzuki et al. |
| 5,665,262 A | 9/1997 | Hajaligol et al. |
| 5,692,525 A | 12/1997 | Counts et al. |
| 5,723,228 A | 3/1998 | Okamoto |
| 5,750,964 A | 5/1998 | Counts et al. |
| 5,878,752 A | 3/1999 | Adams et al. |
| 5,902,501 A | 5/1999 | Nunnally et al. |
| 5,934,289 A | 8/1999 | Watkins et al. |
| 5,949,346 A | 9/1999 | Suzuki et al. |
| 5,970,719 A | 10/1999 | Merritt |
| 6,026,820 A | 2/2000 | Baggett, Jr. et al. |
| 6,390,333 B1 * | 5/2002 | Bozzo .................... B05B 15/00 222/113 |
| 6,615,840 B1 | 9/2003 | Fournier et al. |
| 6,756,731 B1 * | 6/2004 | Sano ...................... H01L 33/56 257/10 |
| 6,803,550 B2 | 10/2004 | Sharpe et al. |
| 6,810,883 B2 | 11/2004 | Felter et al. |
| 7,082,825 B2 | 8/2006 | Aoshima et al. |
| 7,594,945 B2 | 9/2009 | Kim et al. |
| 7,682,571 B2 | 3/2010 | Kim et al. |
| 7,726,320 B2 | 6/2010 | Robinson et al. |
| 8,205,622 B2 | 6/2012 | Pan |
| 8,558,147 B2 | 10/2013 | Greim et al. |
| 8,602,037 B2 | 12/2013 | Inagaki |
| 8,689,804 B2 | 4/2014 | Fernando et al. |
| 8,833,364 B2 | 9/2014 | Buchberger |
| 8,997,754 B2 | 4/2015 | Tucker et al. |
| 9,084,440 B2 | 7/2015 | Zuber et al. |
| 9,165,484 B2 | 10/2015 | Choi |
| 9,295,286 B2 | 3/2016 | Shin |
| 9,347,644 B2 | 5/2016 | Araki et al. |
| 9,405,148 B2 | 8/2016 | Chang et al. |
| 9,420,829 B2 | 8/2016 | Thorens et al. |
| 9,516,899 B2 | 12/2016 | Plojoux et al. |
| 9,532,600 B2 | 1/2017 | Thorens et al. |
| 9,541,820 B2 | 1/2017 | Ogawa |
| 9,693,587 B2 | 7/2017 | Plojoux et al. |
| 9,713,345 B2 | 7/2017 | Farine et al. |
| 9,814,269 B2 | 11/2017 | Li et al. |
| 9,839,238 B2 | 12/2017 | Worm et al. |
| 9,844,234 B2 | 12/2017 | Thorens et al. |
| 9,848,651 B2 | 12/2017 | Wu |
| 9,854,845 B2 | 1/2018 | Plojoux et al. |
| 9,949,507 B2 | 4/2018 | Flick |
| 9,974,117 B2 | 5/2018 | Qiu |
| 10,070,667 B2 | 9/2018 | Lord et al. |
| 10,104,909 B2 | 10/2018 | Han et al. |
| 10,104,911 B2 | 10/2018 | Thorens et al. |
| 10,136,673 B2 | 11/2018 | Mironov |
| 10,136,675 B2 | 11/2018 | Li et al. |
| 10,143,232 B2 | 12/2018 | Talon |
| 10,238,149 B2 | 3/2019 | Hon |
| 10,390,564 B2 | 8/2019 | Fernando et al. |
| 10,412,994 B2 | 9/2019 | Schennum et al. |
| 10,426,193 B2 | 10/2019 | Schennum et al. |
| 10,548,350 B2 | 2/2020 | Greim et al. |
| 10,555,555 B2 | 2/2020 | Fernando et al. |
| 10,602,778 B2 | 3/2020 | Hu et al. |
| 10,617,149 B2 | 4/2020 | Malgat et al. |
| 10,694,783 B2 | 6/2020 | Jochnowitz |
| 10,701,973 B2 | 7/2020 | Lee |
| 10,757,975 B2 | 9/2020 | Batista et al. |
| 10,842,194 B2 | 11/2020 | Batista et al. |
| 10,973,087 B2 | 4/2021 | Wang et al. |
| 11,051,545 B2 | 7/2021 | Batista et al. |
| 11,051,550 B2 | 7/2021 | Lin et al. |
| 11,147,316 B2 | 10/2021 | Farine et al. |
| 2003/0116414 A1 * | 6/2003 | Maeda ................. H01H 25/041 200/56 R |
| 2003/0226837 A1 | 12/2003 | Blake et al. |
| 2004/0089314 A1 | 5/2004 | Felter et al. |
| 2004/0149737 A1 | 8/2004 | Sharpe et al. |
| 2005/0142036 A1 | 6/2005 | Kim et al. |
| 2006/0176710 A1 * | 8/2006 | Meinke .................... B60R 13/04 362/503 |
| 2006/0186431 A1 * | 8/2006 | Miki ...................... H01L 33/505 257/100 |
| 2006/0267614 A1 | 11/2006 | Lee et al. |
| 2007/0007266 A1 | 1/2007 | Sasaki et al. |
| 2007/0074734 A1 | 4/2007 | Braunshteyn et al. |
| 2007/0246382 A1 | 10/2007 | He |
| 2007/0267031 A1 | 11/2007 | Hon |

(56) References Cited

U.S. PATENT DOCUMENTS

| | | |
|---|---|---|
| 2010/0074616 A1 | 3/2010 | Kewitsch |
| 2010/0313901 A1 | 12/2010 | Fernando et al. |
| 2011/0155718 A1 | 6/2011 | Greim et al. |
| 2011/0226236 A1 | 9/2011 | Buchberger |
| 2011/0234069 A1 | 9/2011 | Chen et al. |
| 2013/0014772 A1 | 1/2013 | Liu |
| 2013/0044496 A1* | 2/2013 | Seki .................. F21V 5/04 |
| | | 362/311.02 |
| 2013/0220466 A1 | 8/2013 | Zandiyeh et al. |
| 2013/0228191 A1 | 9/2013 | Newton |
| 2013/0255675 A1 | 10/2013 | Liu |
| 2013/0319999 A1 | 12/2013 | Plojoux et al. |
| 2014/0060554 A1 | 3/2014 | Collett et al. |
| 2014/0069424 A1 | 3/2014 | Poston et al. |
| 2014/0209105 A1 | 7/2014 | Sears et al. |
| 2014/0217085 A1 | 8/2014 | Alima |
| 2014/0261487 A1 | 9/2014 | Chapman et al. |
| 2014/0286630 A1 | 9/2014 | Buchberger |
| 2014/0339509 A1 | 11/2014 | Choi et al. |
| 2014/0345633 A1 | 11/2014 | Talon et al. |
| 2014/0353856 A1 | 12/2014 | Dubief |
| 2015/0020831 A1 | 1/2015 | Weigensberg et al. |
| 2015/0163859 A1 | 6/2015 | Schneider et al. |
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0321879 A1 | 11/2016 | Oh et al. |
| 2016/0324216 A1 | 11/2016 | Li et al. |
| 2016/0331030 A1 | 11/2016 | Ampolini et al. |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0049155 A1 | 2/2017 | Liu |
| 2017/0055589 A1 | 3/2017 | Fernando et al. |
| 2017/0105454 A1 | 4/2017 | Li et al. |
| 2017/0119051 A1 | 5/2017 | Blandino et al. |
| 2017/0119053 A1 | 5/2017 | Henry, Jr. et al. |
| 2017/0143041 A1 | 5/2017 | Batista et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0303598 A1 | 10/2017 | Li et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0049471 A1 | 2/2018 | Holoubek et al. |
| 2018/0160733 A1 | 6/2018 | Leadley et al. |
| 2018/0199630 A1 | 7/2018 | Qiu |
| 2019/0059448 A1 | 2/2019 | Talon |
| 2019/0159524 A1 | 5/2019 | Qiu |
| 2019/0281896 A1 | 9/2019 | Chapman et al. |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0261000 A1 | 8/2020 | Kim et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0404969 A1 | 12/2020 | Zuber et al. |
| 2021/0146067 A1 | 5/2021 | Buchberger |

FOREIGN PATENT DOCUMENTS

| | | |
|---|---|---|
| CN | 1078621 A | 11/1993 |
| CN | 1126425 A | 7/1996 |
| CN | 1190335 A | 8/1998 |
| CN | 1280661 A | 1/2001 |
| CN | 1491598 A | 4/2004 |
| CN | 1633247 A | 6/2005 |
| CN | 1871987 A | 12/2006 |
| CN | 101277622 A | 10/2008 |
| CN | 101301963 A | 11/2008 |
| CN | 101324490 A | 12/2008 |
| CN | 201253138 Y | 6/2009 |
| CN | 101518361 A | 9/2009 |
| CN | 201314692 Y | 9/2009 |
| CN | 101557728 A | 10/2009 |
| CN | 101637308 A | 2/2010 |
| CN | 201657047 U | 11/2010 |
| CN | 201996322 U | 10/2011 |
| CN | 102264251 A | 11/2011 |
| CN | 102595943 A | 7/2012 |
| CN | 202385727 U | 8/2012 |
| CN | 102665459 A | 9/2012 |
| CN | 202854031 U | 4/2013 |
| CN | 103099319 A | 5/2013 |
| CN | 202907797 U | 5/2013 |
| CN | 203040065 U | 7/2013 |
| CN | 103271447 A | 9/2013 |
| CN | 103477252 A | 12/2013 |
| CN | 103519351 A | 1/2014 |
| CN | 103653257 A | 3/2014 |
| CN | 103653258 A | 3/2014 |
| CN | 203492793 U | 3/2014 |
| CN | 103720056 A | 4/2014 |
| CN | 103889258 A | 6/2014 |
| CN | 103974635 A | 8/2014 |
| CN | 103974638 A | 8/2014 |
| CN | 103974640 A | 8/2014 |
| CN | 103997922 A | 8/2014 |
| CN | 104146353 A | 11/2014 |
| CN | 104188110 A | 12/2014 |
| CN | 104219973 A | 12/2014 |
| CN | 204120226 U | 1/2015 |
| CN | 204132401 U | 2/2015 |
| CN | 204146340 U | 2/2015 |
| CN | 104423130 A | 3/2015 |
| CN | 204317492 U | 5/2015 |
| CN | 204393344 U | 6/2015 |
| CN | 204483007 U | 7/2015 |
| CN | 104886776 A | 9/2015 |
| CN | 105188430 A | 12/2015 |
| CN | 204838003 U | 12/2015 |
| CN | 105326092 A | 2/2016 |
| CN | 205072064 U | 3/2016 |
| CN | 205180371 U | 4/2016 |
| CN | 205214209 U | 5/2016 |
| CN | 105722416 A | 6/2016 |
| CN | 205358219 U | 7/2016 |
| CN | 205358225 U | 7/2016 |
| CN | 105852221 A | 8/2016 |
| CN | 105852225 A | 8/2016 |
| CN | 205456064 U | 8/2016 |
| CN | 105919162 A | 9/2016 |
| CN | 205624474 U | 10/2016 |
| CN | 106136331 A | 11/2016 |
| CN | 106163304 A | 11/2016 |
| CN | 106170215 A | 11/2016 |
| CN | 205671480 U | 11/2016 |
| CN | 106231934 A | 12/2016 |
| CN | 106235419 A | 12/2016 |
| CN | 205831079 U | 12/2016 |
| CN | 106418729 A | 2/2017 |
| CN | 106473232 A | 3/2017 |
| CN | 106473233 A | 3/2017 |
| CN | 106490686 A | 3/2017 |
| CN | 106535680 A | 3/2017 |
| CN | 106690427 A | 5/2017 |
| CN | 106723379 A | 5/2017 |
| CN | 106793834 A | 5/2017 |

(56) References Cited

FOREIGN PATENT DOCUMENTS

| | | |
|---|---|---|
| CN | 206197012 U | 5/2017 |
| CN | 106912985 A | 7/2017 |
| CN | 206314585 U | 7/2017 |
| CN | 106998816 A | 8/2017 |
| CN | 107105772 A | 8/2017 |
| CN | 206442590 U | 8/2017 |
| CN | 206443202 U | 8/2017 |
| CN | 206443214 U | 8/2017 |
| CN | 107173850 A | 9/2017 |
| CN | 107183789 A | 9/2017 |
| CN | 107205491 A | 9/2017 |
| CN | 206462413 U | 9/2017 |
| CN | 107249366 A | 10/2017 |
| CN | 107278125 A | 10/2017 |
| CN | 206547882 U | 10/2017 |
| CN | 107801375 A | 3/2018 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 1 947 965 A2 | 7/2008 |
| EP | 2 201 850 A1 | 6/2010 |
| EP | 2 316 286 A1 | 5/2011 |
| EP | 2 327 318 A1 | 6/2011 |
| EP | 2 340 729 A1 | 7/2011 |
| EP | 2 677 273 A1 | 12/2013 |
| EP | 2 921 065 A1 | 9/2015 |
| EP | 3 104 721 A | 12/2016 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| ER | 2368449 A1 | 9/2011 |
| GB | 2 301 894 A | 12/1996 |
| GB | 2514893 A | 12/2014 |
| JP | S4863677 U | 8/1973 |
| JP | 62-15793 A | 1/1987 |
| JP | S63-68690 U | 5/1988 |
| JP | 6-73784 U | 10/1994 |
| JP | 7-72809 A | 3/1995 |
| JP | 7-184627 A | 7/1995 |
| JP | 8-122942 A | 5/1996 |
| JP | 9-75058 A | 3/1997 |
| JP | 9-161822 A | 6/1997 |
| JP | 9-228919 A | 9/1997 |
| JP | 10-37781 A | 2/1998 |
| JP | 2001-200495 A | 7/2001 |
| JP | 2002-514910 A | 5/2002 |
| JP | 2003-527127 A | 9/2003 |
| JP | 2004-212102 A | 7/2004 |
| JP | 2005-199913 A | 7/2005 |
| JP | 2006-252897 A | 9/2006 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2012-513750 A | 6/2012 |
| JP | 2013-509160 A | 3/2013 |
| JP | 2013-524835 A | 6/2013 |
| JP | 2014132560 A | 7/2014 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-2009-0047236 A | 5/2009 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0044165 A | 4/2014 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-1526287 B1 | 6/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-2017-0057535 A | 5/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |

(56) References Cited

FOREIGN PATENT DOCUMENTS

| | | | |
|---|---|---|---|
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/102092 A1 | 7/2014 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/117702 A1 | 8/2015 |
| WO | 2015/150759 A1 | 10/2015 |
| WO | 2015/174657 A1 | 11/2015 |
| WO | 2015/177046 A1 | 11/2015 |
| WO | 2015168828 A1 | 11/2015 |
| WO | 2015/189388 A1 | 12/2015 |
| WO | 2016/005601 A1 | 1/2016 |
| WO | 2016/009202 A1 | 1/2016 |
| WO | 2016/012795 A1 | 1/2016 |
| WO | 2016/091658 A1 | 6/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/184978 A1 | 11/2016 |
| WO | 2016/199065 A1 | 12/2016 |
| WO | 2016/199066 A1 | 12/2016 |
| WO | 2016/207407 A1 | 12/2016 |
| WO | 2017/001520 A1 | 1/2017 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Jun. 11, 2020 by the Korean Patent Office in application No. 10-2018-0051469.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Extended European Search Report dated Jan. 15, 2021 in European Application No. 18799246.6.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Communication dated Feb. 24, 2021 by the Japanese Patent Office in application No. 2020-503962.
Communication dated Mar. 23, 2021 by the Japanese Patent Office in application No. 2020-522897.
Communication dated Mar. 2, 2021 by the Japanese Patent Office in application No. 2020-523669.

(56) References Cited

OTHER PUBLICATIONS

Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 18806877.9.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Communication dated Aug. 26, 2022 from the Chinese Patent Office in Chinese Application No. 201880048703.8.
Communication dated Jul. 12, 2022 from the Chinese Patent Office in Chinese Application No. 201880049189.X.
Communication dated Jul. 4, 2022 from the Chinese Patent Office in Chinese Application No. 201880048657.1.
Communication dated Jun. 22, 2022 from the Chinese Patent Office in Chinese Application No. 201880048444.9.
Communication dated Jun. 28, 2022 from the Japanese Patent Office in Japanese Application No. 2020-522897.
Su Zuen et al., "Heat Transfer", Dalian Maritime University Press, 1989, pp. 12-13 (9 pages total).
Notice of Reasons for Refusal issued in the Japanese Patent Office dated Nov. 1, 2022 in corresponding Japanese Patent Application No. 2020-501205.
Decision of rejection issued in the China National Intellectual Property Administration in corresponding Chinese Patent Application No. 201880055847.6 dated Dec. 29, 2022.
Notice of Reasons for Refusal issued in the Japanese Patent Office in corresponding Japanese Patent Application No. 2021-122551 dated Dec. 20, 2022.
First Office Action dated Jan. 20, 2023, issued in the Chinese Patent Office in corresponding Chinese Patent Application No. 202010761215.0.
Notice of Reasons for Refusal dated Jan. 10, 2023 in the Japanese Patent Office in corresponding Japanese Patent Application No. 2021-080578.
First Office Action issued Jan. 28, 2023 in the China National Intellectual Property Administration in corresponding Chinese Patent Application No. 202010761219.9.
Notice of Reasons for Refusal issued on Feb. 14, 2023 in the Japanese Patent Office in corresponding Japanese Patent Application No. 2022-074915.
Office Action issued Mar. 30, 2023 in Chinese Application No. 201880030661.5.
Office Action issued May 12, 2023 in Chinese Application No. 201880048703.8.
Jia Wei-Ping et al., "Determination of Aerosol concentration in Mainstrewam Cigarette Smoke Based on Online Impact", Tobacco Science & Technology, Manufacturing Technology, Dec. 2010, vol. 281 (4 pages total).
Extended European Search Report issued Dec. 12, 2023 in Application No. 23210344.0.
Chinese Office Action issued Feb. 23, 2024 in Application No. 202010761215.0.

* cited by examiner

OPTICAL MODULE AND AEROSOL GENERATION DEVICE COMPRISING SAME

CROSS REFERENCE TO RELATED APPLICATIONS

This application is a National Stage of International Application No. PCT/KR2018/012773 filed Oct. 26, 2018, claiming priority based on Korean Patent Application No. 10-2017-0142578, filed Oct. 30, 2017 and Korean Patent Application No. 10-2018-0069645 filed Jun. 18, 2018.

TECHNICAL FIELD

Exemplary embodiments relate to an optical module and an aerosol generation device including the same, and more particularly, to an optical module for minimizing light-blurring and an aerosol generation device including the same and being capable of generating an aerosol.

BACKGROUND ART

Recently, the demand for light-emitting diode (LED) light sources is increasing. This is because LED light sources have longer lifetimes than other light sources, have low power consumption, and can be produced in a small size. Therefore, LED light sources are used not only as lighting such as fluorescent lamps, but are also attached to various electronic devices.

In the case of LED light source modules attached to electronic devices of the related art, however, light-blurring occurs due to the refraction and diffusion of light due to coloring coating materials or internal materials. In order to minimize light-blurring, the thickness and structure of a material may be adjusted, but this method has limitations due to design problems, economic problems, etc. of electronic devices.

To solve this issue, there is a need for technology to enable condensing of light by adjusting the angle at which light is refracted by the materials of a module, thereby preventing the deterioration of a visual effect which is caused by a reduced amount of light due to the refraction and reflection of light.

DESCRIPTION OF EXEMPLARY EMBODIMENTS

Technical Problem

Various exemplary embodiments provide an optical module and an aerosol generation device including the same. The technical problem to be solved by the present disclosure is not limited to the technical problems as described above, and further technical problems can be inferred from the following exemplary embodiments.

Solution to Problem

To address the above technical problem, an optical module includes a light-emitting portion for emitting light, and a display including: a first surface having a first transmission region to transmit at least a portion of the light emitted from the light-emitting portion and a first blocking region which is surface-treated to block the transmission of the light; and a second surface on which the light passing through the first transmission region reaches to deliver an image a user, wherein the first transmission region may include a path changing member for changing a propagation path of the transmitted light.

In one exemplary embodiment, the path changing member may further include a curved surface protruding toward the light-emitting portion.

In one exemplary embodiment, the path changing member may further include a condensing lens for condensing the transmitted light. In one exemplary embodiment, the first blocking region may extend along the longitudinal direction of the first surface from each of one end and the other end of the first transmission region.

In one exemplary embodiment, the second surface may be spaced apart from the first surface by a predetermined distance.

In one exemplary embodiment, the display may include a material that transmits light with a predetermined transmittance.

In one exemplary embodiment, the second surface may be surface-treated to block the transmission of light incident from the outside of the optical module.

In one exemplary embodiment, the second surface may include a second transmission region through which at least a portion of the light that has passed through the first transmission region of the first surface and a second blocking region which is surface-treated to block the transmission of the light, and the display may further include a third surface on which the light that has passed through the second transmission region reaches and is displayed.

In one exemplary embodiment, the third surface may include a material that transmits light with a predetermined transmittance.

In one exemplary embodiment, the third surface may be surface-treated to block the transmission of light incident from the outside of the optical module.

In one exemplary embodiment, the light is diffused while passing through the path changing member, and the diffused light reaches the second surface and delivers an image to the user.

In addition, an aerosol generation device according to another aspect may include the optical module of any one of the above exemplary embodiments.

Advantageous Effects of Disclosure

The present disclosure may provide an optical module and an aerosol generation device including the same. In detail, an optical module according to the present disclosure includes a light-emitting portion for emitting light, and a display including a first surface having a first transmission region to transmit at least a portion of the light emitted from the light-emitting portion and a first blocking region which is surface-treated to block the transmission of the light, and a second surface on which the light that has passed through the first transmission region reaches and is displayed, wherein the first transmission region may be in the form of a convex lens. In this case, the light transmitted by the first transmission region configured in the form of a convex lens may be condensed, and thus, the light emitted from the light-emitting portion may reach a target region without loss of light, thereby preventing light-blurring and enabling the efficient light-transmission.

BEST MODE

An optical module may include a light-emitting portion for emitting light and a display including a first surface having a first transmission region to transmit at least a portion of the light emitted from the light-emitting portion and a first blocking region which is surface-treated to block the transmission of the light, and a second surface on which the light that has passed through the first transmission region reaches to deliver an image to a user, wherein the first transmission region may include a path changing member to change a propagation path of the transmitted light.

MODE OF DISCLOSURE

With respect to the terms in the various exemplary embodiments, the general terms which are currently and widely used are selected in consideration of functions of structural elements in the various exemplary embodiments of the present disclosure. However, meanings of the terms can be changed according to intention, a judicial precedence, the appearance of a new technology, and the like. In addition, in certain cases, a term which is not commonly used can be selected. In such a case, the meaning of the term will be described in detail at the corresponding portion in the description of the present disclosure. Therefore, the terms used in the various exemplary embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

Hereinafter, the present disclosure will now be described more fully with reference to the accompanying drawings, in which exemplary embodiments of the present disclosure are shown such that one of ordinary skill in the art may easily work the present disclosure. The disclosure may, however, be embodied in many different forms and should not be construed as being limited to the exemplary embodiments set forth herein.

Hereinafter, exemplary embodiments of the present disclosure will be described in detail with reference to the drawings.

Figure 1:
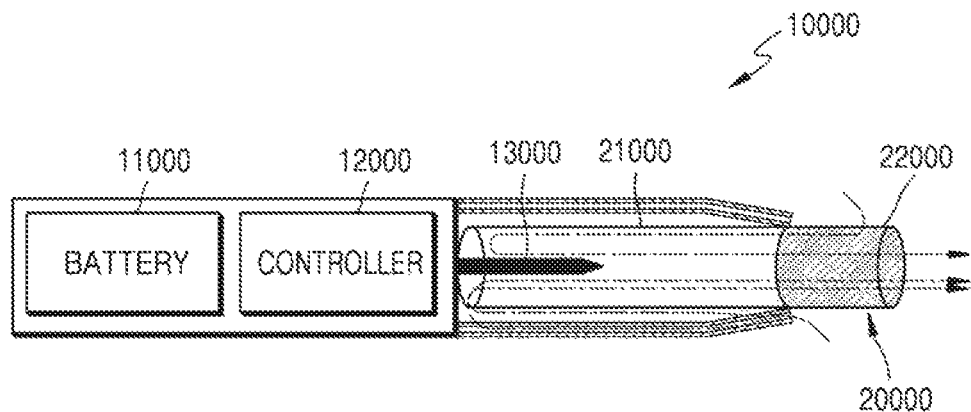
FIGS. 1 through 3 are drawings showing examples in which a cigarette is inserted into an aerosol generation device.
Figure 2:
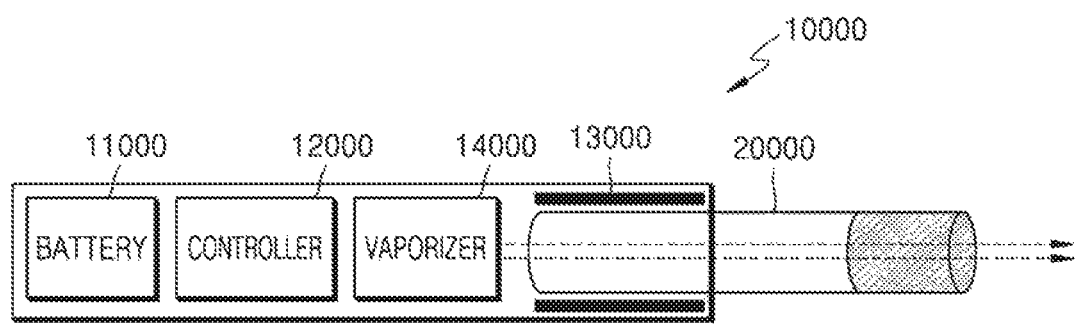
Figure 3:
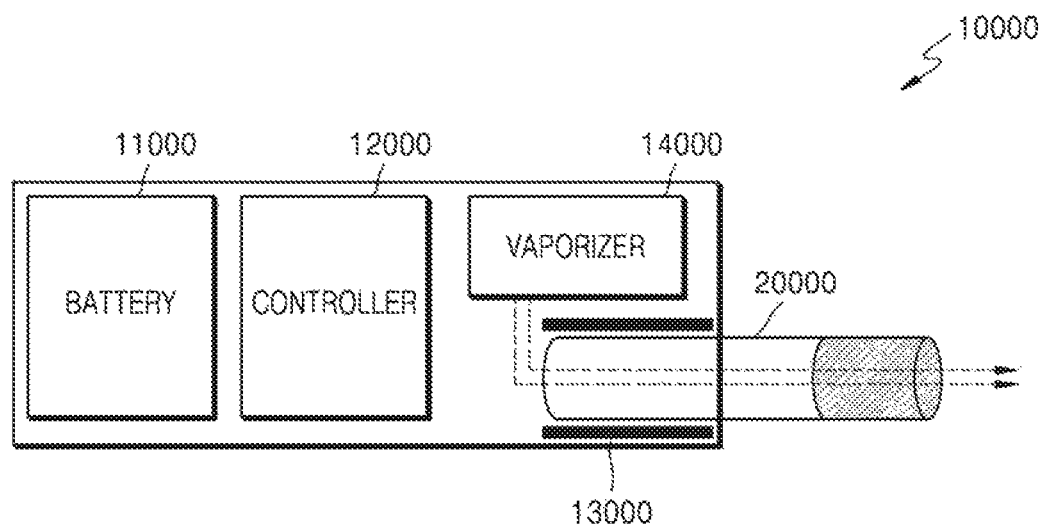

FIGS. 1 through 3 are drawings showing examples in which a cigarette is inserted into an aerosol generating device.

Referring to FIG. 1, the aerosol generation device 10000 may include a battery 11000, a controller 12000, and a heater 13000. Referring to FIGS. 2 and 3, the aerosol generation device 10000 may further include a vaporizer 14000. Also, the cigarette 20000 may be inserted into an inner space of the aerosol generation device 10000.

FIGS. 1 through 3 illustrate components of the aerosol generation device 10000, which are related to the present exemplary embodiment. Therefore, it will be understood by one of ordinary skill in the art related to the present exemplary embodiment that other general-purpose components may be further included in the aerosol generation device 10000, in addition to the components illustrated in FIGS. 1 through 3.

Also, FIGS. 2 and 3 illustrate that the aerosol generation device 10000 includes the heater 13000. However, as necessary, the heater 13000 may be omitted.

FIG. 1 illustrates that the battery 11000, the controller 12000, and the heater 130000 are arranged in series. On the other hand, FIG. 2 illustrates that the battery 11000, the controller 12000, the vaporizer 14000, and the heater 13000 are arranged in series. Also, FIG. 3 illustrates that the vaporizer 14000 and the heater 13000 are arranged in parallel. However, the internal structure of the aerosol generation device 10000 is not limited to the structures illustrated in FIGS. 1 through 3. In other words, according to the design of the aerosol generation device 10000, the battery 11000, the controller 12000, the heater 13000, and the vaporizer 14000 may be differently arranged.

When the cigarette 20000 is inserted into the aerosol generation device 10000, the aerosol generation device 10000 may operate the heater 13000 and/or the vaporizer 14000 to generate an aerosol from the cigarette 20000 and/or the vaporizer 14000. The aerosol generated by the heater 13000 and/or the vaporizer 14000 is delivered to a user by passing through the cigarette 20000.

As necessary, even when the cigarette 20000 is not inserted into the aerosol generation device 10000, the aerosol generation device 10000 may heat the heater 13000.

The battery 11000 may supply power to be used for the aerosol generation device 10000 to operate. For example, the battery 11000 may supply power to heat the heater 13000 or the vaporizer 14000, and may supply power for operating the controller 12000. Also, the battery 11000 may supply power for operations of a display, a sensor, a motor, etc. mounted in the aerosol generation device 10000.

The controller 12000 may generally control operations of the aerosol generation device 10000. In detail, the controller 12000 may control not only operations of the battery 11000, the heater 13000, and the vaporizer 14000, but also operations of other components included in the aerosol generation device 10000. Also, the controller 12000 may check a state of each of the components of the aerosol generation device 10000 to determine whether or not the aerosol generation device 10000 is able to operate.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generation device 10000, the heater 13000 may be located outside the cigarette 20000. Thus, the heated heater 13000 may increase a temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may be implemented using any other heaters which are capable of being heated to a desired temperature. Here, the desired temperature may be pre-set in the aerosol generation device 10000 or may be manually set by a user.

As another example, the heater 13000 may include an induction heater. In detail, the heater 13000 may include an electrically conductive coil for heating a cigarette by an induction heating method, and the cigarette may include a susceptor which may be heated by the induction heater.

For example, the heater 13000 may include a tube-type heating element, a plate-type heating element, a needle-type heating element, or a rod-type heating element. The heater 13000 may heat the inside or the outside of the cigarette 20000, according to the shape of the heating element.

Also, the aerosol generation device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000 and the others may be arranged outside the cigarette 20000. In addition, the shape of the heater 13000 is not limited to the shapes illustrated in FIGS. 1 through 3 and may include various shapes.

The vaporizer 14000 may generate aerosol by heating a liquid composition, and the generated aerosol may pass through the cigarette 20000 to be delivered to a user. In other words, the aerosol generated by the vaporizer 14000 may move along an air flow passage of the aerosol generation device 10000. The air flow passage may be configured such that the aerosol generated via the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generation device 10000 as independent modules.

The liquid storage may store a liquid composition. For example, the liquid composition may be a liquid including a tobacco-containing material having a volatile tobacco flavor component, or a liquid including a non-tobacco material. The liquid storage may be detachable from the vaporizer 14000, or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be positioned as being wound around the liquid delivery element. The heating element may be heated by a current supply and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generation device 10000 may further include general-purpose components in addition to the battery 11000, the controller 12000, the heater 13000, and the vaporizer 14000. For example, the aerosol generation device 10000 may include a display capable of outputting visual information and/or a motor for outputting haptic information. Also, the aerosol generation device 10000 may include at least one sensor (a puff detecting sensor, a temperature detecting sensor, a cigarette insertion detecting sensor, etc.). Also, the aerosol generation device 10000 may have a structure where the external air may be introduced or internal air may be discharged, even when the cigarette 20000 is inserted into the aerosol generation device 10000.

Although not illustrated in FIGS. 1 through 3, the aerosol generation device 10000 and an additional cradle may form together a system. For example, the cradle may be used to charge the battery 11000 of the aerosol generation device 10000. Also, the heater 13000 may be heated when the cradle and the aerosol generation device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generation device 10000, and the second portion may be exposed to the outside. Alternatively, only a portion of the first portion may be inserted into the aerosol generation device 10000. Otherwise, the entire first portion and a portion of the second portion may be inserted into the aerosol generation device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generation device 10000. For example, opening and closing of the air passage and/or a size of the air passage may be adjusted by the user. Accordingly, the amount of smoke and smoking satisfaction may be adjusted by the user. As another example, the external air may flow into the cigarette 20000 through at least one hole formed in a surface of the cigarette 20000.

Hereinafter, an example of the cigarette 20000 will be described with reference to FIG. 4.

Figure 4:
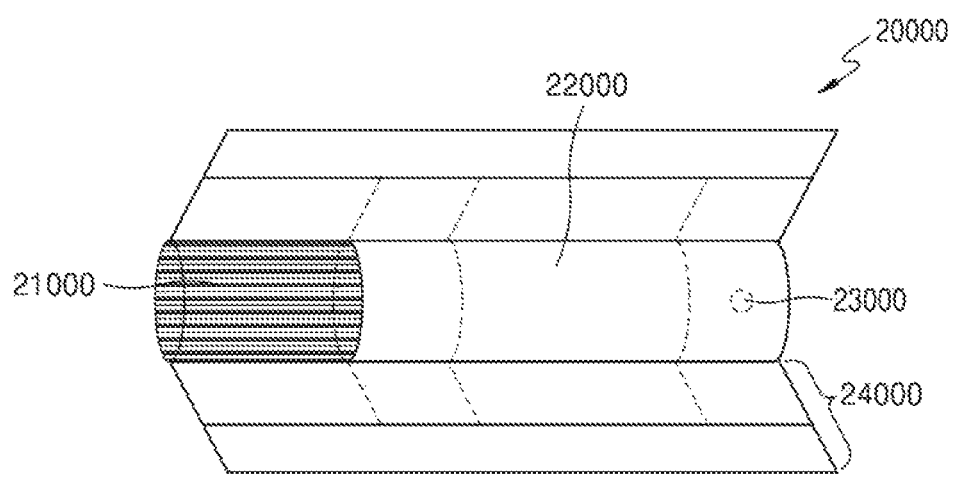
FIG. 4 illustrates an example of a cigarette.

FIG. 4 illustrates an example of a cigarette.

Referring to FIG. 4, the cigarette 20000 may include a tobacco rod 21000 and a filter rod 22000. The first portion 21000 described above with reference to FIGS. 1 through 3 may include the tobacco rod, and the second portion may include the filter rod 22000.

FIG. 4 illustrates that the filter rod 22000 includes a single segment. However, the filter rod 22000 is not limited thereto.

In other words, the filter rod 22000 may include a plurality of segments. For example, the filter rod 22000 may include a first segment configured to cool aerosol and a second segment configured to filter a certain component included in the aerosol. Also, as necessary, the filter rod 22000 may further include at least one segment configured to perform other functions.

The cigarette 2000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be coupled to each other, and the entire cigarette 20000 may be packaged using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers and which are coupled to each other, may be re-packaged using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat-conducting material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved. Also, the heat conductive material surrounding the tobacco rod 21000 may function as a susceptor heated by the induction heater. Here, although not illustrated in the drawings, the tobacco rod 21000 may further include an additional susceptor, in addition to the heat conductive material surrounding the tobacco rod 21000.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In some exemplary embodiments, the cooling segment may include a cellulose acetate filter having a plurality of holes. However, the cooling segment is not limited to the above-described example and any other cooling segment that is capable of cooling the aerosol may be used.

Although not illustrated in FIG. 4, the cigarette 20000 according to an exemplary embodiment may further include a front-end filter. The front-end filter may be located on a side of the tobacco rod 21000, which is the side away from the filter rod 22000. The front-end filter may prevent the tobacco rod 21000 from being detached outwards and prevent a liquefied aerosol from flowing into the aerosol generation device 10000 (FIGS. 1 through 3) from the tobacco rod 21000, during smoking.

Figure 5A:
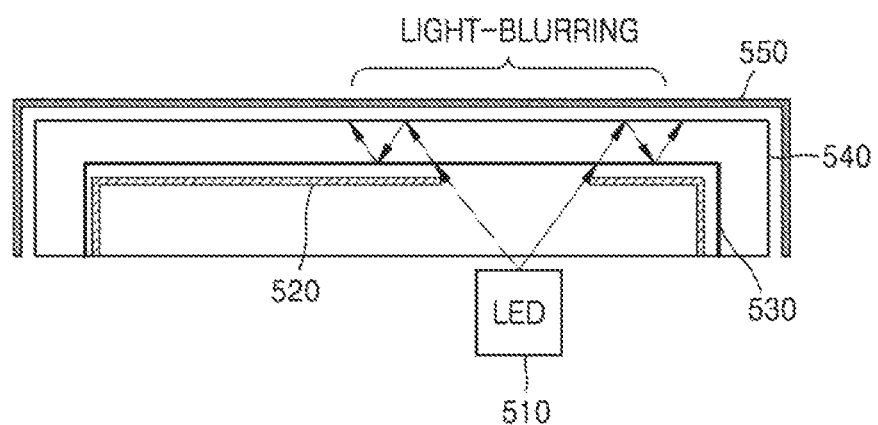
FIGS. 5A and 5B are drawings illustrating a configuration of an optical module according to some exemplary embodiments.
Figure 5B:
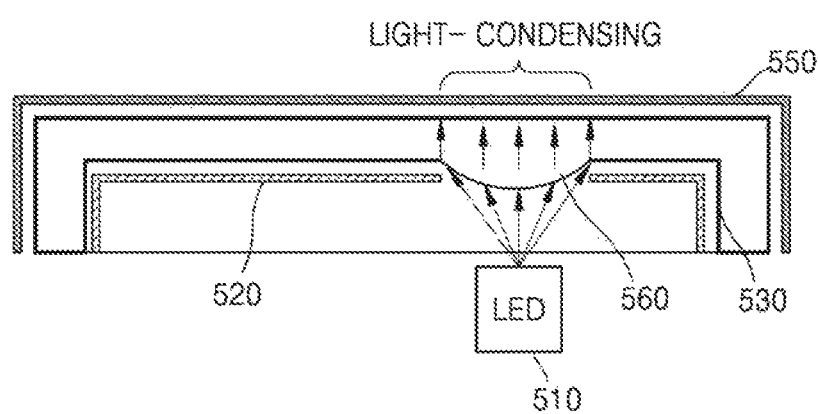

FIGS. 5A and 5B are drawings illustrating a configuration of an optical module according to the exemplary embodiments.

In detail, FIG. 5A is a drawing illustrating an optical module in which light-blurring occurs according to the prior art. FIG. 5B is a drawing illustrating an optical module for preventing light-blurring, according to an exemplary embodiment.

Referring to FIGS. 5A and 5B, the optical module may include a light-emitting portion 510, and a display including a first surface 530 and a second surface 540. FIGS. 5A and 5B illustrate only some components of the optical module related to the present exemplary embodiment. Therefore, it will be understood by those skilled in the art that other general components may be further included in the optical module in addition to the components illustrated in FIGS. 5A and 5B. For example, the optical module may include at least one electrical connector (not shown) for electrical connection between the light-emitting portion 510 and the battery 11000.

In addition, the display including the first surface 530 and the second surface 540 may include a transparent material and/or a semi-transparent material. That is, the display may include a material that transmits light with a predetermined transmittance. In detail, the semi-transparent material refers to a material that has the transmittance of light greater than 0% and less than 100%. For example, the material may include glass or plastic materials such as polymethylmethacrylate and polycarbonate. However, exemplary embodiments of the present disclosure are not limited thereto and other materials may also be used.

Referring to FIG. 5A, the light emitted from the light-emitting portion 510 may progress toward the first surface 530. In general, the light-emitting portion 510 may include a light source, and exemplary embodiments of the present disclosure will be described assuming that the light source is a light-emitting diode (LED) light source. However, the light source included in exemplary embodiments of the present disclosure is not limited thereto and may include other light sources such as a lamp.

Light emitted from the light-emitting portion 510 may reach the second surface 540 through the first surface 530. In this case, when the light reaches and is displayed on the second surface 540, the light may be visually recognized. In detail, light may reach the second surface 540 to deliver an image to a user. To perform this process, a portion of the second surface 540 on which light finally reaches needs to be limited.

In detail, referring to FIG. 5A, when the light emitted from the light-emitting portion 510 passes through the first surface 530, so a region through which the light transmits needs to be limited. To this end, a portion of the first surface 530 may be surface-treated to block the transmission of light. In this case, the first surface 530 may include a first blocking region 520 and a transmission region. For convenience of description, the surface treatment region will be referred to as the first blocking region 520. A surface treatment may be implemented by applying a non-transmissive spray on the first surface 530 so that light does not transmit the area. However, the present disclosure is not limited thereto and may be implemented by other methods such as placing a material that blocks light on the first surface 530. In an exemplary embodiment, the first blocking region 520 may extend in the longitudinal direction of the first surface 530 from both ends of the transmission region. In detail, the other region outside the transmission region on the first surface 530 may correspond to the first blocking region 520, which will be described later with reference to FIG. 6.

As described above, light is blocked by the first blocking region 520, and only light that has passed through the transmission region may reach the second surface 540. The second surface 540 may be spaced apart from the first surface 530 by a predetermined distance. The distance may vary depending on factors such as the size of the optical module. In this case, referring to FIG. 5A, a region of the second surface 540 on which light reaches may vary according to the size of the transmission region. In detail, when the light emitted from the light-emitting portion 510 reaches the second surface 540 through the transmission region of the first surface 530, light is reflected according to an angle between the emitted light and the boundary of the transmission region of the first surface 530 and the first blocking region 520. As a result, the region of the second surface 540 on which light reaches may vary. In detail, when the transmission region is wide, the region of the second surface 540 on which light reaches may be wide.

Referring to FIG. 5A, when the light emitted from the light-emitting portion 510 reaches the second surface 540 through the transmission region of the first surface 530, some of the light that does not reach perpendicularly on the second surface 540 may be transmitted and some of the light may be reflected. The reflected light may then be reflected again on the first surface 530 or elsewhere in the structure, and this process may be repeated. At this time, light may reach a portion other than the target region of the second surface 540, which leads to light-blurring.

In addition, referring to FIG. 5A, the second surface 540 may include a second blocking region 550. The second blocking region 550 may be implemented by surface-treating an outer portion of the second surface 540. This surface treatment may be implemented by applying a semi-transmissive spray so that the second blocking region 550 transmits the light emitted from the light-emitting portion 510 to the outside and prevents light incident from the outside of the optical module from progressing into the optical module. However, exemplary embodiments are not limited thereto and may be implemented by using other materials capable of controlling transmittance.

By the process described above, the user may visually recognize the light through the second surface 540. When the user visually recognizes light, due to the second blocking region 550, light incident from the outside does not pass through the second surface 540 and is blocked, so that the user may not recognize the internal structure of the optical module. Instead, the use may only recognize the light emitted from the light-emitting portion 510. By this implementation, an aesthetic of design may be obtained.

Referring to FIG. 5B, according to an exemplary embodiment, the first surface 530 may further include a first transmission region 560.

Since the light-emitting portion 510 and the like included in the exemplary embodiment illustrated in FIG. 5B are the same as the above-described elements, redundant description thereof will be omitted.

The first transmission region 560 may include a path changing member that may change the path of light when the light emitted from the light-emitting portion 510 passes through the first surface 530. Such a structure may be provided by making the first transmission region 560, which is part of the first surface 530, in the form of a convex lens during a manufacturing process. The shape of the convex lens described above may be convex on the side facing the light-emitting portion 510. However, exemplary embodiments are not limited thereto. For example, the convex lens may have any structure that allows light to be condensed. In one exemplary embodiment, the convex lens may be any lens that is convex on both sides.

In addition, light may be diffused while passing through the path changing member. In detail, when the light emitted from the light-emitting portion 510 passes through the first surface 530, the light may diffuse. For example, light is diffused while passing through the path changing member, and the diffused light may reach the second surface 540 to deliver an image to the user.

In this case, if the size of the first transmission region 560 is small, the transmitted light may not reach the entire surface of the second surface 540, and thus the user may not receive a satisfactory image. However, according to the exemplary embodiment, when the light emitted from the light-emitting portion 510 passes through the first surface 530, the refractive index of the transmission region may be adjusted to allow light to reach the entire portion of the second surface 540.

Although not shown, even in the case in which light is diffused, a structure for minimizing light-blurring may be used. In detail, the light emitted from the light-emitting portion 510 may be diffused while passing through the path changing member, and then the light diffused may be condensed again to fit a target size on the second surface 540.

In the present exemplary embodiment, when the light emitted from the light-emitting portion 510 passes through the first transmission region 560, the light may be condensed or diffused. In general, light-blurring may be minimized by reducing the thickness of a part through which light passes or a distance from a light source to a part through which light passes. However, for example, in the process of manufacturing such a structure by using plastic, an injection process may be performed by using a mold to obtain low manufacturing costs and achieve the consistency in the product shape. In this case, however, there could be a limitation to minimizing the thickness of the product in terms of the manufacturing process.

The distance from the light source to the light-transmission part may not be sufficiently reduced due to the design constraints of the device in which the optical module is mounted. In such a case, when the design is changed to reduce the distance, the competitiveness of the product may be reduced.

In addition, a separate structure for condensing or diffusing light may be arranged. In this case, however, due to the additional manufacture of a separate structure, the competitiveness of the product may be lowered. Also, the additional manufacture and the additional assembling process may lead to the assembly deviation. In detail, in the assembly process of the optical module and a separate structure, air gaps may occur therebetween, and in this case, primary light loss may occur when light is transmitted.

Although not shown in the drawings, a semi-transmissive coating material may be applied to the convex portion of the first transmission region 560. By this process, the transmittance may be adjusted, or the refractive index may be adjusted by using the coating material.

Figure 6:
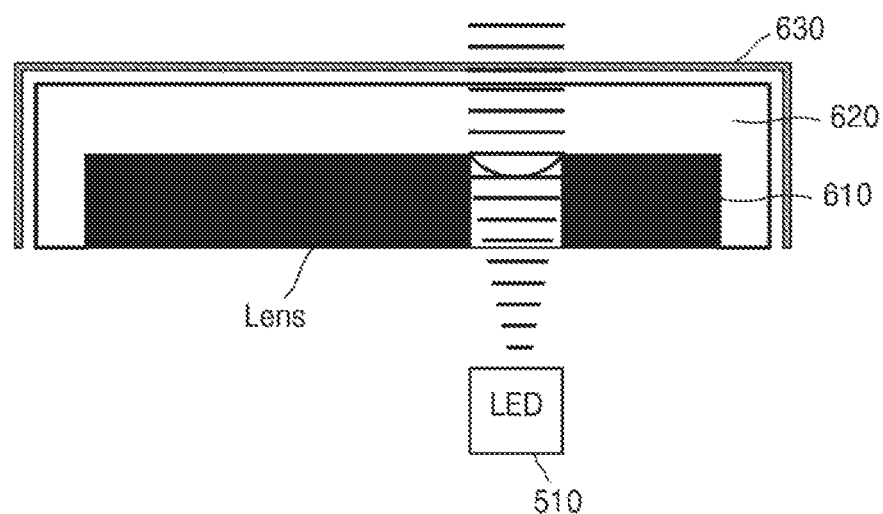
FIG. 6 shows a drawing illustrating a configuration of an optical module according to some exemplary embodiments.

FIG. 6 shows a configuration of an optical module according to an exemplary embodiment.

Referring to FIG. 6, a space between the light-emitting portion 510 and the display 620 in the optical module may be filled with a material that does not transmit light. In detail, in order to limit the region on which the light emitted from the light-emitting portion 510 reaches, a light-incident region may be limited.

Referring to FIG. 6, a portion of the space between the light-emitting portion 510 and the display 620 is filled with a material that does not transmit light, so that the light emitted from the light-emitting portion 510 reaches only a first transmission region of a first surface without reaching a first blocking region of the first surface.

Figure 7:
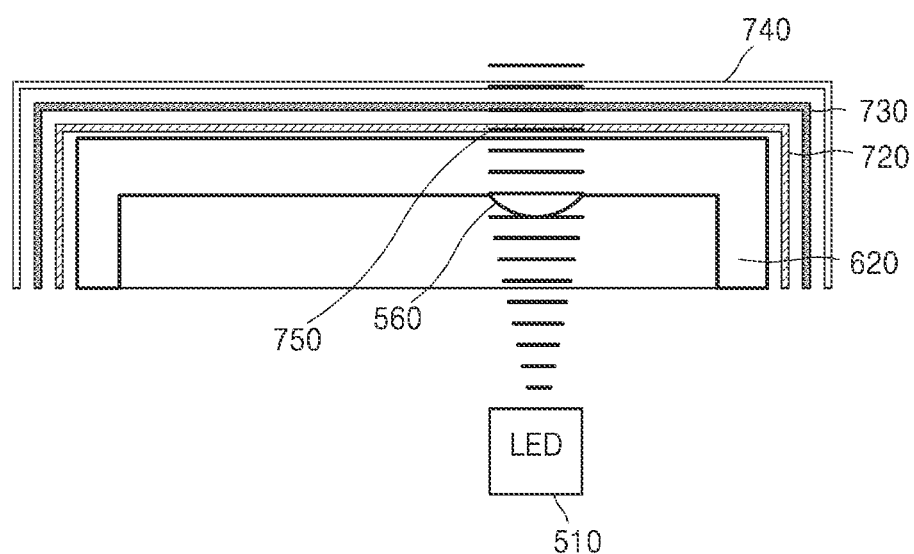
FIG. 7 shows a drawing illustrating a configuration of an optical module according to some exemplary embodiments.

FIG. 7 shows a configuration of an optical module according to an exemplary embodiment.

Referring to FIG. 7, a second surface may transmit at least a portion of the light that passed through the first transmission region 560 and block a portion of the light that is not transmitted. To this end, the second surface may include a second transmission region 750. In detail, the second surface may include the second transmission region 750 and a second blocking region 720. As described above, the second blocking region 720 illustrated in FIG. 5 may be formed by surface-treating the outer portion of the second surface. The second blocking region 720 illustrated in FIG. 7 may be the same as the second blocking region 550 of FIG. 5, in that a blocking region is implemented by surface-treating the outer portion of the second surface. However, in the case of the second blocking region 720 of FIG. 7, the outer portion of the second surface is not entirely surface-treated. That is, the second transmission region 750 is not surface-treated while the other portion of the second surface is surface-treated, to allow the second surface to include the second transmission region 750. In other words, the second blocking region 720 of FIG. 7 may refer to the portion of the second surface outside the second transmission region 750. To emphasize the difference, different reference numerals are used for corresponding elements.

In detail, the second transmission region 750 of the second surface may not be surface-treated, and the second blocking region 720 thereof may be surface-treated. This surface treatment may be performed by applying a non-transmissive spray so that light is not transmitted. However, exemplary embodiments are not limited thereto, and other methods may instead be used in which a material that does not transmit light is arranged. In this regard, only light that has passed the first transmission region 560 provided in the form of the convex lens for condensing light and reached the second transmission region of the second surface, may pass the second surface. By contrast, light that is diffused and reaches the second blocking region 720, may not pass the second surface, thereby preventing the light-blurring.

Referring to FIG. 7, a surface treatment 730 may be performed on the second transmission region 750 and the second blocking region 720. The surface treatment 730 may be performed by applying a semi-transmissive spray, which enables the second transmission region 750 and the second blocking region 720 allow light emitted from the light-emitting portion 510 to be transmitted to the outside while blocking light incident from outside. However, exemplary embodiments are not limited thereto and the surface treatment 730 may be implemented by using other materials capable of controlling transmittance.

In addition, the optical module may further include a third surface 740 above the surface-treatment. The third surface 740 may include a transparent material and/or a semi-transparent material, but the composing material is not limited thereto. That is, the third surface 740 may include a material that transmits light with a predetermined transmittance. Light emitted from the light-emitting portion 510 and transmitted through the first transmission region 560 and the second transmission region 750 may reach the third surface 740.

As such, the user may visually recognize the light through the third surface 740. When the user visually recognizes light, due to the semi-transmissive surface treatment 730, light incident from the outside is blocked without passing therethrough. As a result, the user may not recognize the internal structure of the optical module, and may only recognize the light emitted from the light-emitting portion 510. Accordingly, the design aesthetic may be increased.

Figure 8:
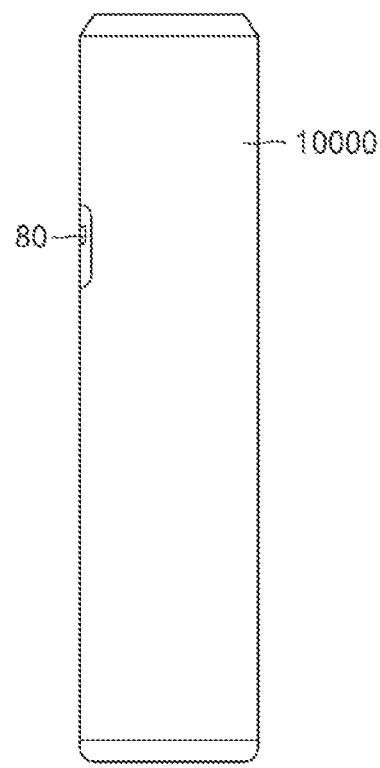
FIG. 8 shows a drawing illustrating a configuration of an aerosol generation device including an optical module according to some exemplary embodiments.

FIG. 8 shows a configuration of an aerosol generation device 10000 including an optical module according to an exemplary embodiment.

Referring to FIG. 8, the aerosol generation device 10000 may further include an optical module 80. The optical module 80 is not limited to the above-described exemplary embodiments.

The optical module 80 may display an internal operating state of the aerosol generation device by selecting and emitting one of a plurality of colors that are set in advance. However, exemplary embodiments are not limited thereto, and a different method may be used to notify of the internal operating state of the aerosol generation device.

The operations of the optical module 80 as described above may be controlled through a controller 12000.

Those of ordinary skill in the art related to the present exemplary embodiments may understand that various changes in form and details can be made therein without departing from the scope of the characteristics described above. The disclosed methods should be considered in a descriptive sense only and not for purposes of limitation. The scope of the present disclosure is shown in the claims rather than the foregoing description, and all differences within the scope will be construed as being included in the present disclosure.

What is claimed is:
1. An optical module comprising:
a light-emitting portion which emits light; and
a display comprising:
a first surface having a first transmission region through which at least a portion of the light emitted from the light-emitting portion is transmitted and a first blocking region which blocks transmission of the light; and a second surface which the transmitted light reaches to deliver an image to a user, wherein the first transmission region comprises a path changing member for changing a propagation path of the transmitted light, wherein the first blocking region blocks transmission of the light such that no light is emitted from the first blocking region toward the second surface, wherein the second surface comprises a second transmission region through which at least a portion of the light transmitted through the first transmission region is transmitted and a second blocking region that is surface-treated such that no light passes through the second blocking region, wherein the display further comprises a third surface which light transmitted through the second transmission region reaches to be displayed thereon, wherein the path changing member comprises a condensing lens configured to condense the light emitted from the light-emitting portion onto the second transmission region, and wherein the display further comprises a semi-transmissive surface between the first surface and the second surface such that light incident from outside is blocked and the light emitted from the light-emitting portion is transmitted through semi-transmissive surface.

2. The optical module of claim 1, wherein the path changing member comprises a curved surface protruding toward the light-emitting portion.

3. The optical module of claim 1, wherein the first blocking region extends along a longitudinal direction of the first surface from both ends of the first transmission region.

4. The optical module of claim 1, wherein the second surface is spaced apart from the first surface by a predetermined distance.

5. The optical module of claim 1, wherein the display comprises a material that transmits light with a predetermined transmittance.

6. The optical module of claim 1, wherein the second surface is surface-treated to block transmission of light incident from outside of the optical module.

7. The optical module of claim 1, wherein the third surface comprises a material that transmits light with a predetermined transmittance.

8. The optical module of claim 7, wherein the third surface is surface-treated to block transmission of light incident from outside of the optical module.

9. An aerosol generation device comprising the optical module of claim 1.

* * * * *